United States Patent

Suenaga et al.

[19]

[11] Patent Number: 4,489,219

[45] Date of Patent: Dec. 18, 1984

[54] A-15 SUPERCONDUCTING COMPOSITE WIRES AND A METHOD FOR MAKING

[75] Inventors: Masaki Suenaga, Bellport; Carl J. Klamut, East Patchogue; Thomas S. Luhman, Westhampton Beach, all of N.Y.

[73] Assignee: The United States of America as represented by the United States Department of Energy, Washington, D.C.

[21] Appl. No.: 500,806

[22] Filed: Jun. 8, 1983

Related U.S. Application Data

[63] Continuation-in-part of Ser. No. 394,080, Jul. 1, 1982, abandoned, which is a continuation of Ser. No. 178,655, Aug. 15, 1980, abandoned.

[51] Int. Cl.$^3$ ...................... H01B 12/00; H01L 39/24
[52] U.S. Cl. .................................. 174/128 S; 29/599; 174/126 S; 174/126 CP
[58] Field of Search .......... 174/126 CP, 126 S, 128 S; 29/599

[56] References Cited

U.S. PATENT DOCUMENTS

| | | | |
|---|---|---|---|
| 2,050,298 | 8/1936 | Everett | 174/126 CP |
| 3,728,165 | 4/1973 | Howlett | 174/126 S X |
| 3,731,374 | 5/1973 | Suenaga et al. | 174/126 S X |
| 3,783,503 | 1/1974 | Diepers | 174/126 S X |
| 3,811,185 | 5/1974 | Howe et al. | 174/126 S X |
| 3,868,768 | 3/1975 | Meyer | 174/126 S X |
| 3,905,839 | 9/1975 | Hashimoto | 29/599 |
| 4,053,976 | 10/1977 | Scanlan | 29/599 |
| 4,094,060 | 6/1978 | Madsen et al. | 29/599 |
| 4,205,119 | 5/1980 | Young et al. | 174/126 S X |

FOREIGN PATENT DOCUMENTS

| | | | |
|---|---|---|---|
| 2826810 | 12/1979 | Fed. Rep. of Germany | 174/128 S |
| 142584 | 11/1979 | Japan | 29/599 |

OTHER PUBLICATIONS

Fietz, William A.; Nb$_3$Sn in 1978: State of the Art; IEEE Transactions on Magnetics; Jan. 1979; vol. Mag. 15, No. 1.
Hashimoto, Y. et al.; Processing and Properties of Superconducting Nb$_3$Sn Filamentary Wires; Fifth International Cryogenic Engineering Conference; Kyoto, Japan, 1974.
Suenaga, M. et al.; Superconducting Properties of Multifilamentary Nb$_3$Sn Made by a New Process; Applied Physics Letters, vol. 20, No. 11, Jun. 1972.
Suenaga, W. et al.; Fabrication Techniques and Properties of Multifilamentary Nb$_3$Sn Conductors; IEEE Transactions on Magnetics; vol. Mag. 17, No. 1, Jan. 1971.

*Primary Examiner*—John F. Gonzales
*Assistant Examiner*—Morris H. Nimmo
*Attorney, Agent, or Firm*—Vale P. Myles; Jeannette Walder

[57] ABSTRACT

A method for fabricating superconducting wires wherein a billet of copper containing filaments of niobium or vanadium is rolled to form a strip which is wrapped about a tin-alloy core to form a composite. The alloy is a tin-copper alloy for niobium filaments and a gallium-copper alloy for vanadium filaments. The composite is then drawn down to a desired wire size and heat treated. During the heat treatment process, the tin in the bronze reacts with the niobium to form the superconductor niobium tin. In the case where vanadium is used, the gallium in the gallium bronze reacts with the vanadium to form the superconductor vanadium gallium. This new process eliminates the costly annealing steps, external tin plating and drilling of bronze ingots required in a number of prior art processes.

13 Claims, 13 Drawing Figures

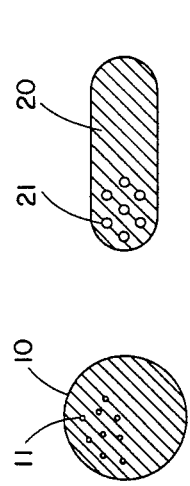
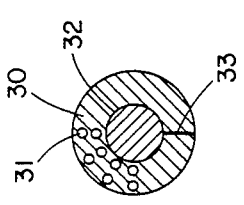
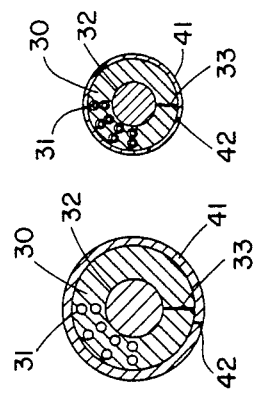
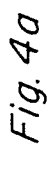
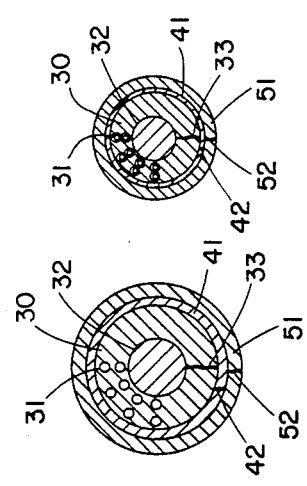
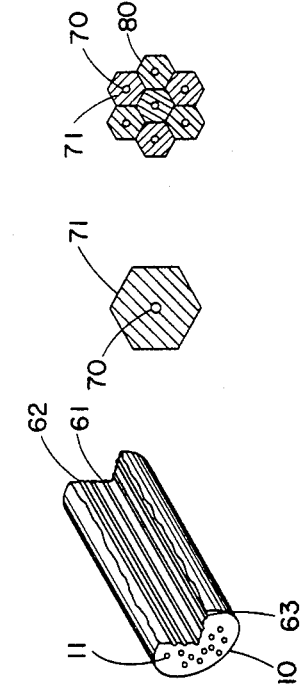
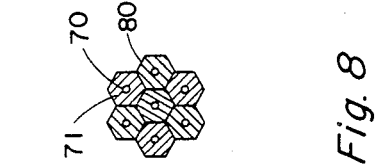
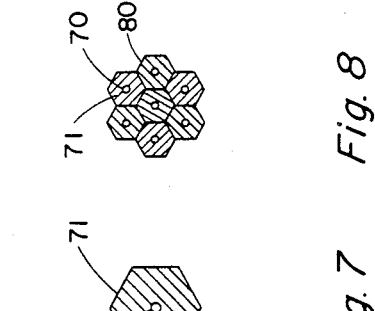

A-15 SUPERCONDUCTING COMPOSITE WIRES AND A METHOD FOR MAKING

This is a continuation-in-part of application Ser. No. 394,080 filed 7/1/82 which, in turn, is a continuation of application Ser. No. 178,655 filed 8/15/80, both now abandoned.

BACKGROUND OF THE INVENTION

1. Field

The present invention relates to the production of superconducting wires and, in particular, to those in which the superconductor is niobium tin ($Nb_3Sn$) or vanadium gallium ($V_3Ga$).

2. Prior Art

A number of processes have been developed for the production of superconducting wires; however, many of these require processing steps such as annealing, tin plating and ingot drilling. These steps add cost and processing time and unfortunately often result in decreased reliability and consistency of the wire or limit the length of the wire. The capacity to produce large, continuous lengths of conductors is important in applications such as magnets for fusion reactors.

In one prior art process for example, holes are drilled in a bronze bar and niobium rods are inserted to form a composite bar. The composite is then drawn down to form a wire. The wire is heat treated to cause the tin within the bronze to react with the niobium to form niobium tin. The difficulty with this process is the bronze work hardens during the drawing process, requiring a series of annealing steps which significantly increase manufacturing costs.

In another prior art process, a composite is formed by inserting niobium rods in a pure copper matrix. This composite is drawn down to form a wire which is passed through a molten tin bath, or which is electroplated with tin. The wire containing the tin coating produced by the bath or electroplating is heat treated to produce niobium tin. This added processing step involving the tin bath or electroplating increases costs and reduces the reliability of the wire.

SUMMARY

To eliminate the shortcomings of existing proceses, a new process for making multifilamentary A-15 superconducting wires was developed. The new process is capable of producing larger wire and longer continuous lengths of wire. To achieve the foregoing, a billet of copper containing filaments of niobium is rolled to form a strip which is wrapped around a tin-alloy core. The tin-alloy core and the wrapping form a composite which is drawn down to a desired wire size, without an intermediate annealing steps. The resulting wire is heat treated at 650°-800° to produce niobium tin. A copper-stabilizer may be added prior to drawing by wrapping tantalum foil over the copper strip containing the niobium filaments. This is followed by the installation of an outer layer of high purity copper. The composite, including the stabilization layers is then drawn and heated in the manner described. Using the same process, vanadium may be substituted for niobium and a gallium-alloy for tin-alloy to produce vanadium gallium wire. The tin-alloy of the subject invention comprises about 80 to 100 percent by weight tin and is preferably alloyed with copper to produce a core having a high ductility which may be drawn easily without annealing. (The use of the phrase "tin-alloy" herein is meant to include 100% by weight tin as a limiting case.) However, other metals may be substituted for copper so long as sufficient ductility is maintained. Small amounts of other materials may also be added to the tin-alloy to impart various properties to the wire produced.

A high ductility, easily drawn, gallium-alloy, such as 50 weight percent gallium with 50 weight percent copper or with 50 weight percent of copper and small amounts of other materials may be used to form the core where a vanadium gallium superconductor is to be formed.

In another embodiment of the wrapping process of the present invention, a cable is formed by bundling a plurality of copper niobium composite wires about a tin-alloy core. This cable is then wrapped with a tantalum foil, which is then wrapped with an outer layer of high purity copper. The wrapped composite is then drawn down to form a wire and subsequently heat treated within a range of 650° to 800° C. to produce niobium tin. In this particular embodiment, the size or number of copper niobium composites and tin-alloy used is not limited by available tubing since the size of tantalum foil and copper wrap may be easily fabricated to fit the cable.

BRIEF DESCRIPTION OF THE DRAWINGS

FIG. 1 is a cross-sectional view of a copper billet containing niobium filaments.

FIG. 2 is a cross-sectional view of the billet of FIG. 1 after rolling to produce a strip.

FIG. 3 is a cross-sectional view of a composite formed of a tin-alloy core wrapped with the strip of FIG. 2.

FIG. 4 is the composite of FIG. 3 wrapped with tantalum foil.

FIG. 4A is a cross-sectional view of the composite show in FIG. 4, after a drawing process step has been effected to reduce the diameters of the composite and its component parts.

FIG. 5 is the composite of FIG. 4 with an outer layer of copper.

FIG. 5A is a cross-sectional view of the composite shown in FIG. 5, illustrating it as it would appear after subjected to a drawing process that reduces the diameters of the composite and its component parts.

FIG. 6 is a perspective view of the billet of FIG. 1 with a section removed to illustrate the internal distribution of niobium filaments.

FIG. 7 is a cross-section of a niobium rod 70 surrounded by a hexagonal copper jacket 71.

FIG. 8 is a cross-section of a number of the composites shown in FIG. 7 assembled in a manner to provide high density packaging.

DETAILED DESCRIPTION OF THE INVENTION

Figure 9:
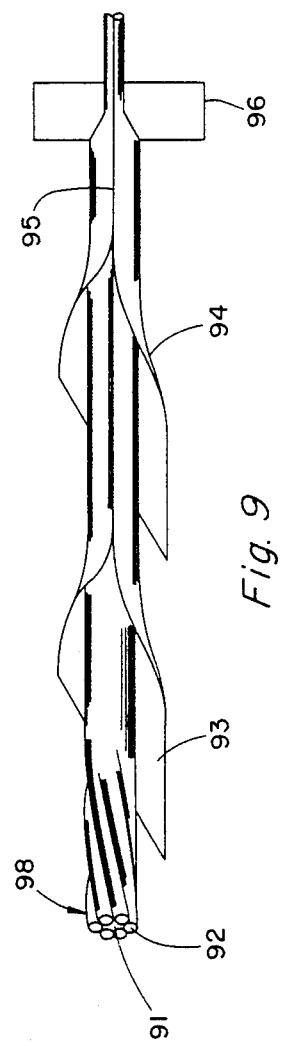
FIG. 9 is a perspective of wire being fabricated according to the cable-wrapping method.
Figure 10:
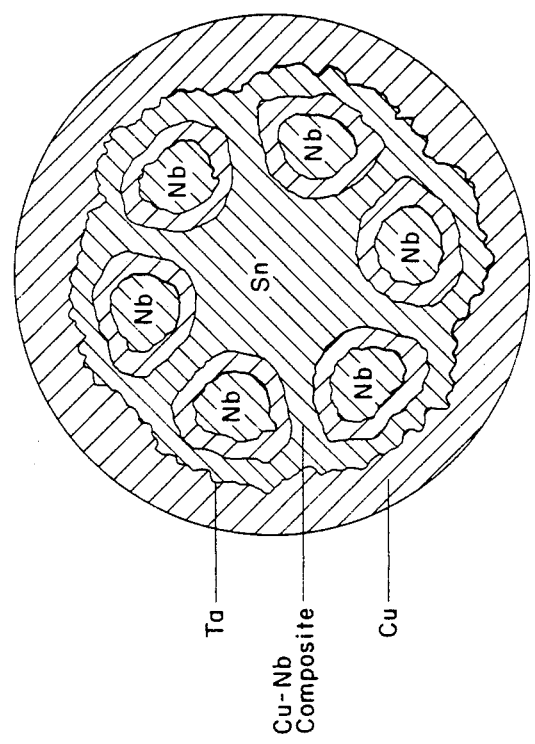
FIG. 10 is an optical micrograph of a wire formed according to the cabling technique of FIG. 9.
Figure 11:
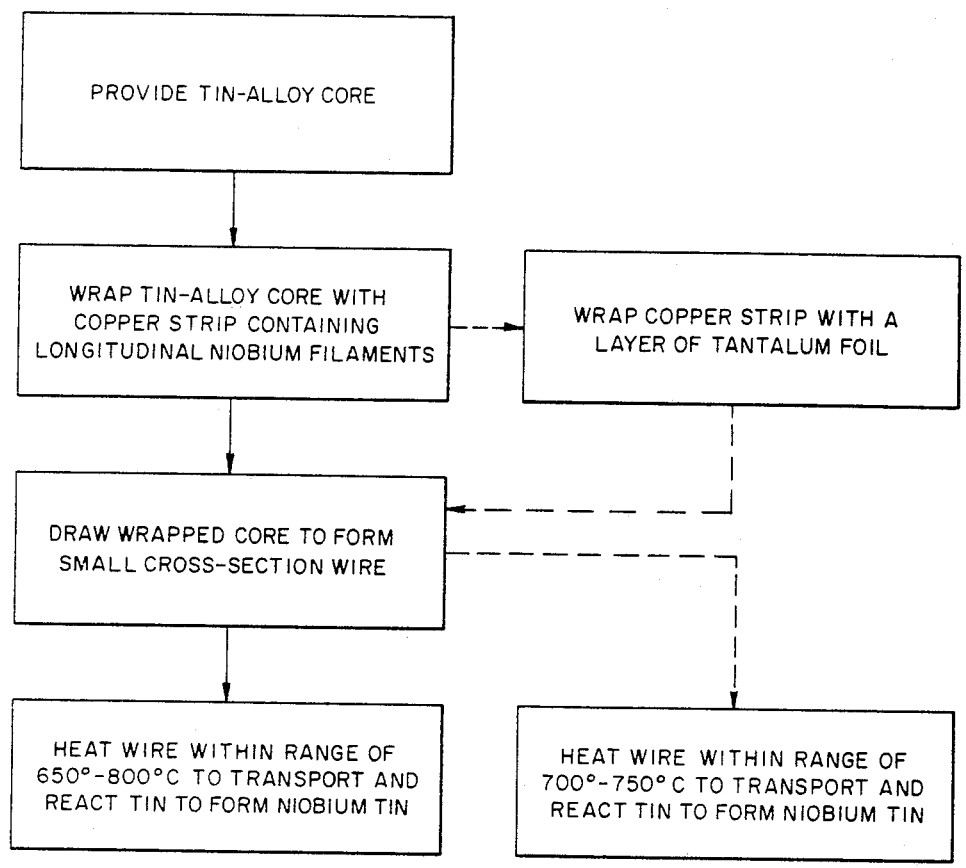
FIG. 11 is a flow chart illustrating the processes of the claimed invention.

FIG. 1 shows a cross-section of a copper billet 10 in which a number of niobium filaments 11 are embedded. In such billets there is typically a uniform distribution of niobium filaments throughout the cross-section of the billet, of which only a representative portion is shown in FIG. 1.

FIG. 6 is a perspective representation of the billet of FIG. 1 in which a section has been removed to show the filaments extending in the longitudinal direction of the billet, as indicated by exposed filaments 61 and 62.

In the process for fabricating superconducting wire in accordance with the present invention, the billet 10 shown in FIG. 1 is first drawn down to a relatively small diameter of nominally 0.2 inch and then rolled into a strip with a cross-sectional area of nominally 0.3 and 0.05 inch, as illustrated in FIG. 2 by the flattened strip 20 containing niobium filaments 21. The term rolling is used herein to generally describe any process used to flatten and convert a billet or wire into a strip.

The strip 20 produced by the rolling operation shown in FIG. 2 is then wrapped about a tin-alloy core 32, as shown in FIG. 3. In this cross-sectional view, the termination 33 of the wrapped strip 30 can be seen in the lower portion of this Figure.

By wrapping herein is meant a process wherein a strip or layer, such as strip 20, is formed into a cylinder or tube, such as wrapped strip 30, surrounding essentially concentric with and essential in contrast with a central core, such as 32. Wrapping, as used herein is meant to exclude spiral wrapping of a strip about a core.

The wrapping process is preferably carried out by passing such a strip through one or more dies, such as those commonly known to those skilled in the art as "crowning dies" to form the strip into a trough or "U" shape. A core is then placed within the "U" and the two are drawn through a circular die to form a wrapped composite, such as is shown in FIG. 3. A composite so formed may then be used as the core for a further wrapping step.

It should be noted that when strip 30 is wrapped as described above, filaments 11 will remain longitudinal.

The core and the wrapping form a composite which is drawn down to a suitably small diameter wire size, as for example 0.12 inches. The cold-working of the composite produces an integrated wire. This wire is heat treated at a temperature range of 650°–800° C., and preferably from about 700°–725° C., during which time the tin in the core migrates through the copper wrapping and reacts with the niobium filaments to form niobium tin.

If, during the use of this wire as a conductor of high electrical current, the temperature of the wire rises above the critical temperature, causing the wire to cease functioning as a superconductor, protection from damage due to current overload may be supplied by an alternate conductor, referred to as a stabilizer.

A stabilizer may be added to the composite prior to the drawing down step by first covering, preferably by wrapping, the composite with tantalum foil. This is shown in FIG. 4 where a foil 41 is shown wrapped about the composite and terminates at the line indicated by drawing numeral 42. The composite with the tantalum foil is then covered by an outer layer, preferably by wrapping, of high purity copper, as shown in FIG. 5. (By high purity copper herein is meant copper having a ratio of resistance at room temperature to resistance at 4.2° K greater than about 100).

The copper outer layer 51 is terminated at line 52. The composite with the tantalum foil and copper outer layer are then drawn down and heat treated as previously described.

The copper outer layer is intended to serve as the alternate current carrier, while the tantalum serves to prevent migration of tin to the outer copper layer. Tin would increase the resistance of the outer copper layer and reduce its effectiveness as a conductor.

The copper billet used in the present invention is formed from relatively low cost, commerically available copper tubing. In this process, a niobium rod is inserted in a copper tube which is then passed throuh a hexagonal die to produce the cross-section, shown in FIG. 7. In passing through the die, the copper 71 is reformed, taking on the shape of the hexagonal die, while the niobium 70 at the center of the structure remains its original shape.

As shown in FIG. 8, a number of the hexagonal tubes 80 may be packed together tightly. These tubes are then placed within a larger copper tube which is passed through a die to produce the billet, shown in FIG. 1. Since the copper is soft, this processing is accomplished rapidly. No drilling is required because the tubes are supplied with the proper hole size. In addition, completed billets of the type shown in FIG. 1 are now commercially available.

In the present invention the tin-alloy core contains a high percentage of tin, typically 80 percent or higher. As a result of the high tin content, the core does not suffer from work-hardening and requires no annealing steps, as did the low tin bronze used in prior art processes.

In FIG. 9, cable 98 is formed by bundling copper niobium composite wires 92 around tin-alloy core 91. Tantalum foil 93 is wrapped about cable 98 and copper outer layer 94 about the tantalum layer. Copper layer 94 is tig welded at 95 and the entire structure is drawn down through die 96 to form a wire. Generally the copper niobium composite wires are niobium filaments wrapped in copper. After drawing down, the wire is then heat treated at a temperature range of 650°–800° C., and preferably from 700°–725° C., during which time the tin in the core migrates through the copper and reacts with the niobium filaments to form niobium tin.

The above described process is not restricted to the production of niobium tin. The superconductor vanadium-gallium may be produced by the same process by substituting vanadium for niobium and high ductility gallium-alloy for tin-alloy, and heat treating at a temperature of about from 550°–700° C. and preferably about from 625°–650° C. Also, for vanadiumn-gallium niobium may be substituted for tantalum.

What is claimed is:

1. A structure comprising:
   (a) a cable having a plurality of copper niobium composite wires bundled about a tin-alloy core;
   (b) a layer of tantalum foil wrapped about said cable; and
   (c) an outer layer of copper wrapped about said tantalum layer.

2. The structure of claim 1 wherein said structure is drawn down to form a wire and the tin in the tin-alloy core is transported and reacted with the niobium by means of heat treatment within the range of 650° to 800° C. to form niobium tin.

3. The structure of claim 2 wherein the heat treatment is in the range of 700°–725° C.

4. A process for making a structure comprising the steps of:
   (a) providing a tin-alloy core; and, (b) wrapping a strip of copper, the copper containing a plurality of longitudinal filaments of niobium, about said core so as to form an exterior layer.

5. A process as described in claim 4, comprising the additional step of:
   (c) drawing the structure so formed down to a small cross-sectional area so as to form a wire.

6. A process as described in claim 5, comprising the additional steps of:
   (d) heat treating the wire so formed within a range of 650° to 800° C. so as to transport tin in the tin-alloy core and react the transported tin with the niobium so as to form the superconductor niobium tin.

7. A process as described in claim 4, comprising the additional steps of:
   (c) wrapping the exterior layer of copper with a layer of tantalum foil; and
   (d) covering the tantalum with an additional layer of high purity copper.

8. A process as described in claim 7, comprising the additional steps of:
   (e) drawing the structure so formed down to a small cross-sectional area so as to form a wire; and
   (f) heat treating the wire so formed within a range of 650° to 800° C. so as to transport tin in the tin-alloy core and react the transported tin with the niobium so as to form the superconductor niobium tin.

9. A process as described in claim 6, wherein the heat treatment is within the range of 700°–750° C.

10. The process of claim 4 wherein said strip of copper is formed by drawing and rolling a billet of copper containing a plurality of longitudinal filaments of niobium.

11. A process as described in claim 8, wherein the heat treatment is within the range of 700°–750° C.

12. A process for making a structure comprising the steps of:
   (a) supplying a tin-alloy core;
   (b) supplying a plurality of copper niobium composite wires;
   (c) forming a cable by bundling said composite wires about said core;
   (d) wrapping tantalum foil about said cable;
   (e) wrapping said tantalum foil with an outer layer of copper;
   (f) drawing down the structure so formed to form a wire; and
   (g) heat treating said wire within a range of 650° to 800° C. to cause tin to migrate to the niobium and react to form niobium tin.

13. The process as described in claim 12 wherein the heat treatment is within the range of 700° to 750° C.

* * * * *